United States Patent
Kim

(10) Patent No.: US 6,625,063 B2
(45) Date of Patent: Sep. 23, 2003

(54) NONVOLATILE SEMICONDUCTOR MEMORY DEVICE AND PROGRAMMING METHOD THEREFOR

(75) Inventor: Myong-Jae Kim, Suwon (KR)

(73) Assignee: Samsung Electronics Co., Ltd. (KR)

( * ) Notice: Subject to any disclaimer, the term of this patent is extended or adjusted under 35 U.S.C. 154(b) by 27 days.

(21) Appl. No.: 10/008,886

(22) Filed: Nov. 8, 2001

(65) Prior Publication Data

US 2002/0167842 A1 Nov. 14, 2002

(30) Foreign Application Priority Data

May 14, 2001 (KR) .................................... 2001-26157

(51) Int. Cl.[7] .............................. G11C 16/04; G11C 7/00
(52) U.S. Cl. .............. 365/185.28; 365/200; 365/230.06
(58) Field of Search ................... 365/185.33, 185.22, 365/185.24, 185.28, 185.04, 189.02, 230.03, 230.06, 200, 185.14

(56) References Cited

U.S. PATENT DOCUMENTS

| | | | | |
|---|---|---|---|---|
| 5,509,018 A | * | 4/1996 | Niijima et al. | 365/185.09 |
| 5,751,637 A | * | 5/1998 | Chen et al. | 365/185.33 |
| 5,956,273 A | * | 9/1999 | Lin et al. | 365/185.14 |
| 6,046,939 A | * | 4/2000 | Noda et al. | 365/185.09 |
| 6,282,121 B1 | * | 8/2001 | Cho et al. | 365/185.22 |
| 6,335,881 B2 | * | 1/2002 | Kim et al. | 365/185.17 |

* cited by examiner

Primary Examiner—Thong Le
(74) Attorney, Agent, or Firm—F. Chau & Associates, LLP

(57) ABSTRACT

A method for reducing programming time of a nonvolatile semiconductor device is provided. In the method, after a plurality of memory cells are programmed by n-bit units, the memory cells are checked to determine whether the programming is completed. If any memory cell fails the programming operation, the reprogramming of the memory cells are performed. For the reprogramming, the n is multiplied by 2, wherein n is an integer not less than 2. Otherwise, if all the memory cells complete the programming or the number of the program operation gets to the maximum value, the memory cells finish the program operation. Accordingly, the method can reduce time for programming of the memory cells.

7 Claims, 13 Drawing Sheets

FIG. 9B (PRIOR ART)

| OPERATION MODE | Vg | Vd | Vs | Vb |
|---|---|---|---|---|
| PROGRAM | +10V | +5V ~ +6V | 0V | 0V |
| ERASE | -10V | Floating | Floating | 5~6V |
| ERASE REPAIR | +3V | +6V~+9V | 0V | 0V |
| READ | +4.5V | +1V | 0V | 0V |

NONVOLATILE SEMICONDUCTOR MEMORY DEVICE AND PROGRAMMING METHOD THEREFOR

BACKGROUND OF THE INVENTION

1. Field of the Invention

The present invention relates to a nonvolatile semiconductor memory device, and more particularly to a nonvolatile semiconductor memory device capable of reducing reprogramming time, and a programming method thereof.

2. Discussion of Related Art

It is well known that nonvolatile semiconductor memory devices can permanently store data in memory cells when an external power goes off, and they are typically used in applications for mask read only memory (MROM), programmable read only memory (PROM), erasable and programmable read only memory (EPROM) and electrically erasable and programmable read only memory (EEPROM) in the nonvolatile memory device. In case of MROM, PROM or EPROM, users cannot easily erase or reprogram stored data because the erasing or reprogramming of the stored data is performed on the board of the memory device. However, in case of EEPROM, users can more easily perform the erase or reprogramming operation, because the EEPROM can be electrically erased and reprogrammed repeatedly, through the application of higher than normal electrical voltage. Therefore, the EEPROMs are used in numerous applications, such as system program storage devices or auxiliary memory devices requiring frequent data renewal. Recently, EEPROMs having a more compact size and capable of operating at high speed are needed in various fields, such as electronic devices controlled by computers or microprocessors, or in a battery powered computer system such as a portable or laptop computer.

To fulfill such need, a NOR-gate type flash EEPROM having a flash erase function has been proposed. The NOR-gate type flash EEPROMs can perform faster write and read operations than NAND type or AND type EEPROMs.

FIG. 9A shows a vertical cross-section of a memory cell transistor in a conventional NOR-gate type flash memory. An n-type source region 3 is formed apart from an n-type drain region 4 on a p-type substrate 2, a p-type channel region is formed between the source region 3 and the drain region 4. On the p-type channel region, a floating gate electrode 6 insulated with a thin insulating layer 7 of less than 100 angstroms and a control gate 8 insulated with another insulating layer 9 are formed in sequence.

FIG. 9B is a table showing voltages applied to various nodes of the memory cell transistor of FIG. 9A during program, erase, erase repair and read modes of operation.

At the program mode, hot electrons are injected from the channel region adjacent the drain region 4 to the floating gate electrode 6. At this time, as shown in FIG. 9B, a high voltage, for example, 10 V is applied to Vg of the control gate electrode 8 and a voltage for generating the hot electrons, for example, 5–6V is applied to Vd of the drain region 4, while the source region 3 and the p-type substrate region 2 are grounded. When negative charge is sufficiently accumulated at the floating gate electrode 6, the memory cell transistor has a higher threshold voltage. On the other hand, at the read mode, a positive voltage, for instance, 1V is applied to Vd of the drain region 4 and a predetermined voltage, for instance, 4.5V is applied to Vg of the control gate electrode 8, while the source region 3 and the substrate region 2 are grounded. During the read mode, the memory cell transistor having the higher threshold voltage remains in an off state, so called "off-cell", therefore current flowing from the drain region 4 to the source region 3 is prevented. At this time, the threshold voltage is about 6–7V.

During erase mode, a Fowler-Nordheim tunneling phenomenon (hereinafter referred to as F-N tunneling) is generated from a bulk region formed at the substrate to the control gate electrode 8. For the F-N tunneling, a high negative voltage, for example, −10V is applied to Vg of the control gate electrode 8 and a voltage for generating the F-N tunneling, for example, 5V is applied to Vb of the bulk region as shown in FIG. 9B. At this time, the impedance of the drain region 4 is high for increasing the effect of the erase operation. Accordingly, a strong magnetic field is formed between the control gate electrode 8 and the bulk region, and the F-N tunneling is generated. Accordingly, the negative charge contained at the floating gate electrode 6 is discharged to the source region 3. It is known that the F-N tunneling happens when the magnetic field of 6–7 MV/cm is applied to the conductive layer between insulating layers. In the memory cell transistor of FIG. 9A, the insulating layer 7 has the thickness of 100 angstroms for generating the F-N tunneling. As a result of the erase operation, the memory cell transistor has a lower threshold voltage.

In a conventional flash memory, the bulk regions of a plurality of cells are commonly connected for high integration, so that the plurality of cells is simultaneously erased during the erase operation. An erase unit is determined according to an amount of dividing of the bulk region. For instance, an erase operation can be performed by 64K byte, and it is called a sector.

During read mode, the memory cell having the lower threshold voltage by the erase operation remains on because a current path is formed from a drain region to a source region. At this time, the memory cell transistor is called an "on-cell". The erased memory cell transistors have a threshold voltage of about 1V–3V. However, during the erase mode wherein the threshold voltage of the memory cell transistors is decreased, the threshold voltage can be less than 0V, instead of 1V–3V. This is due to the uniformity at the plurality of memory cell transistors. Those memory cell transistors having the threshold voltage of less than 0V are named "over-erased" cells, which require curing operations (hereinafter erase-repair operations) for raising the threshold voltage to about 1V–3V. At the erase-repair mode, a positive voltage, for example, 2V–5V is applied to Vg of the control gate electrode 8 and a positive voltage, for example, 6V–9V is applied to Vd of the drain region 4, as shown in FIG. 9B, while the source region 3 and the substrate 2 are grounded in the over erased memory cell transistor. As a result, a smaller amount of negative charge, comparing to that of the program mode, is accumulated at the floating gate electrode 6, and the threshold voltage is about 1V–3V.

FIG. 10 is a graph showing the threshold voltage of memory cell transistors according to the program, erase and erase-repair modes. The horizontal axis indicates the threshold voltages of memory cell transistors, and the vertical axis indicates the distribution of the threshold voltage level. If programmed under the same conditions as in FIG. 9B, the off-cells can have a threshold voltage of approximately 5.2V to 7V while the on-cells can have a threshold voltage of approximately 1V to 3V.

Hereinafter, the operations of the conventional EEPROM will be described. When a program command is inputted from outside, a program checking operation is performed to determine whether the program operation has been completed. The program checking operation checks the current threshold voltage of memory cell transistors to be programmed. If any one of the memory cell transistors is not programmed, a program operation, that is, the hot electron injection is performed. On the other hand, if all the memory cell transistors are programmed, the program is completed and additional programming is not performed. The number of memory cell transistors to be programmed at one time is determined by the capacity of high voltage to be applied to the drain of each memory cell transistor. For instance, the total number of memory cell transistors to be programmed is divided by m (m is a natural number) to optimize the number of memory cell transistors to be programmed at one time. Accordingly, if the total number of the memory cell transistors is 16 and m is 8, the number of memory cell transistors to be programmed at one time will be 2. In general, if one word (16 bits) is to be programmed, and m is 8, and the number of cells to be programmed at one time is 2. It is referred to a 2-bit program hereinafter. After the programming is performed eight times by the unit of 2 bits, the program checking operation will be performed to check whether all the memory cells are completely programmed. If any one of the memory cells fails to be programmed, the reprogramming of the memory cell is performed. Meanwhile, if all the memory cells are completely programmed, or if the number of program loops reaches its maximum value, the programming of the memory cells is completed. In a second programming, that is, in the reprogramming, the 2-bit program operation will be performed 8 times again. At this time, high voltage is not applied to the drain region 4 of the previously programmed memory cell transistors, and the drain region 4 is in a program prohibiting state. When the second program operation is finished, the program checking operation is repeated.

As described above, in the conventional program operation, the time for the whole program increases in proportion to the number of programming to be repeated, because the same programming is performed at the second program operation regardless of the number of program prohibited cells. For instance, if a third programming is performed at the memory cell transistors, the total number of programming is twenty four times, i.e., 3 multiplied by 8. As a result, the programming time increases, and this limits a high-speed operation of the memory device. Therefore, there is a need to minimize the programming time.

SUMMARY OF THE INVENTION

It is an object of the present invention to solve the above problems and provide a method for reducing programming time of a NOR-type nonvolatile semiconductor device.

It is another object of the present invention to provide a nonvolatile semiconductor device capable of minimizing programming time.

It is still another object of the present invention to provide a semiconductor memory device and a related method for reducing reprogramming time.

In accordance with the first aspect of the present invention, there is provided a method for programming a plurality of memory cells of a nonvolatile semiconductor memory device in response to input data having a plurality of bit information comprising the steps of: programming the plurality of memory cells by units of n bits, wherein n is an integer not less than 2; checking whether programming of the plurality of memory cells is complete the programming operation; increasing the units by multiplying the n bits by 2 if any memory cell fails the programming operation; and reprogramming the plurality of memory cells by the units of the multiplied bits. In the method, if all the memory cells complete the programming operation or the number of programming gets to the maximum value, the programming of the plurality of memory cells are finished if all the memory cells complete the programming operation. The nonvolatile semiconductor memory device is preferably a NOR type flash EEPROM.

In accordance with another aspect of the present invention, there is provided a method for programming a plurality of memory cells of a nonvolatile semiconductor memory device comprising the steps of: programming the plurality of memory cells by raising threshold voltage of each memory cell, wherein the programming is performed by n-bit units, wherein n is an integer not less than 2; checking a threshold voltage of each programmed memory cell for determining whether the programmed memory cell complete the programming operation; increasing the number of bits in the units by multiplying the n by 2 if the threshold of any one memory cell among the programmed memory cells is below a predetermined level; reprogramming the plurality of memory cells by the units of the multiplied bits.

In accordance with further aspect of the present invention, there is provided a nonvolatile semiconductor memory device having a plurality of memory cells, in which each of the plurality of memory cells is programmed in response to input data having a plurality of bit information, the nonvolatile semiconductor device comprising: program means for performing program operations of the plurality of memory cells by n-bit units, wherein n is an integer not less than 2; checking means for checking the programmed memory cells to determine all the memory cells complete the programming operation; multiplying means for multiplying the n by 2 if any memory cell fails the programming operation; wherein the program means performs reprogramming of the plurality of memory cells by the units of the multiplied bits.

BRIEF DESCRIPTION OF THE DRAWINGS

For fuller understanding of the nature and object of the invention, reference should be made to the following detailed description taken in conjunction with the accompanying drawings in which:

FIG. 9B is a table showing voltages applied to the conventional NOR memory cell transistor of FIG. 9A;

DESCRIPTION OF PREFERRED EMBODIMENTS

Figure 1:
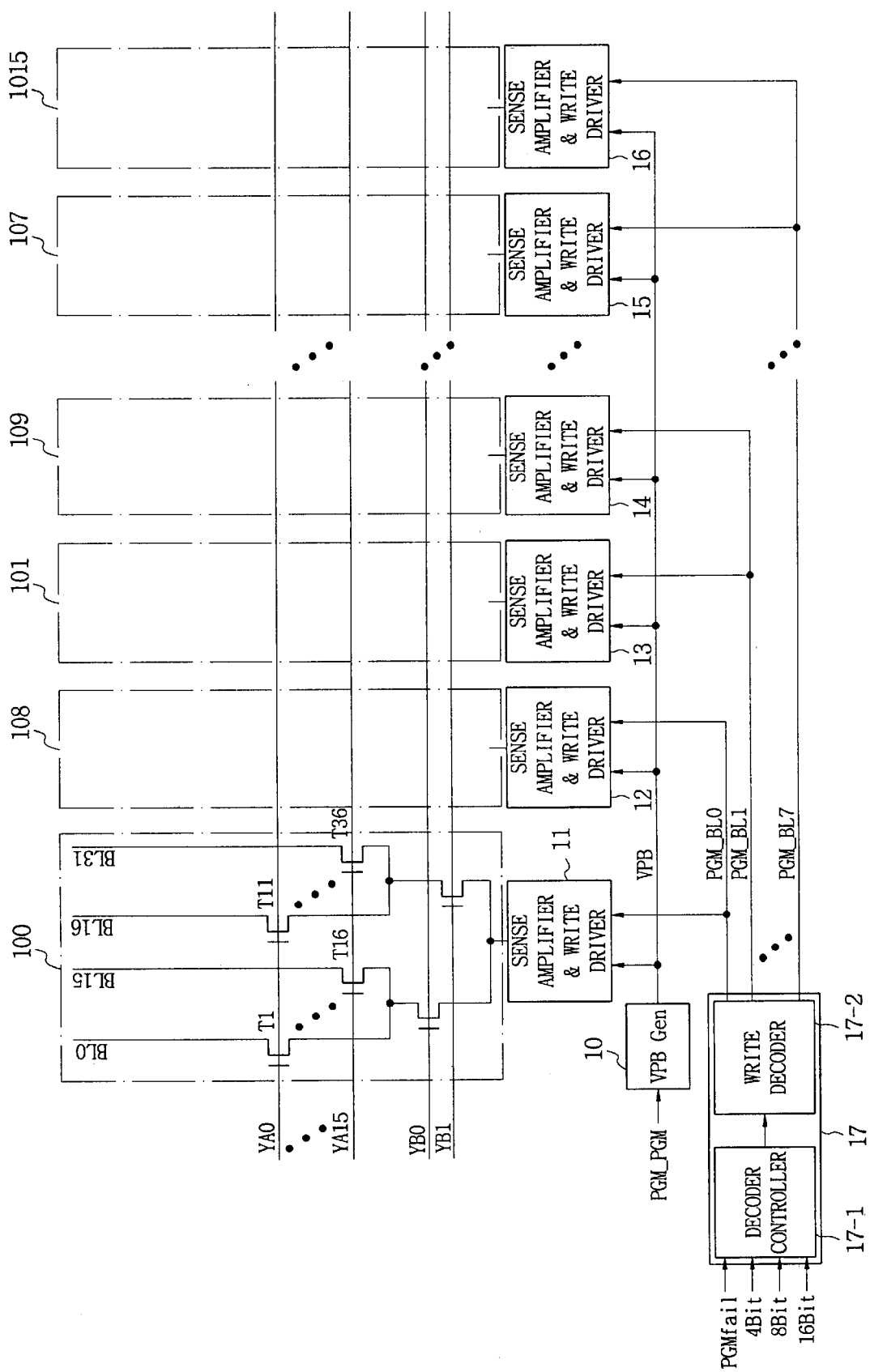
FIG. 1 is a block diagram of a nonvolatile semiconductor memory device employing a preferred embodiment of the present invention.

The aforementioned objects, other objects and aspects of the invention will become apparent from the following detailed description of a preferred embodiment with reference to accompanying drawings. It should be noted that like reference numerals are used for designation of the same or equivalent parts or portion for simplicity of illustration and explanation, detailed description of which is omitted.

Referring to FIG. 1, a nonvolatile memory device employing a preferred embodiment of the present invention has column gate parts 100, 108, 101, 109, 107, 1015 connected with bit lines which in turn are connected with a plurality of memory cells, sense amplifier and write drivers 11, 12, 13, 14, 15, 16, respectively. A high voltage generator 10 and a decoder block 17 also connect to each sense amplifier and write drivers. The high voltage generator 10 generates a high voltage required for programming of memory cells in response to program signals (PGM_PGM) and applies the voltage to the sense amplifier and write drivers 11, 12, 13, 14, 15, 16. The decoder block 17, including a decoder controller 17-1 and a write decoder 17-2, receives a program fail signal (PGMfail) and bit option signals (4, 8, 16 bit) and applies program bit line signals (PGM_BL<0:7>) to a write driver (shown in FIG. 2). In the structure, bit lines of the column gate parts 100, 108, 101, 109, 107, 1015 and memory cells connected to the bit lines have conventional NOR type structures. A plurality of NOR-gate type memory cells form a memory block, and a plurality of memory blocks form a whole memory cell array.

Figure 2:
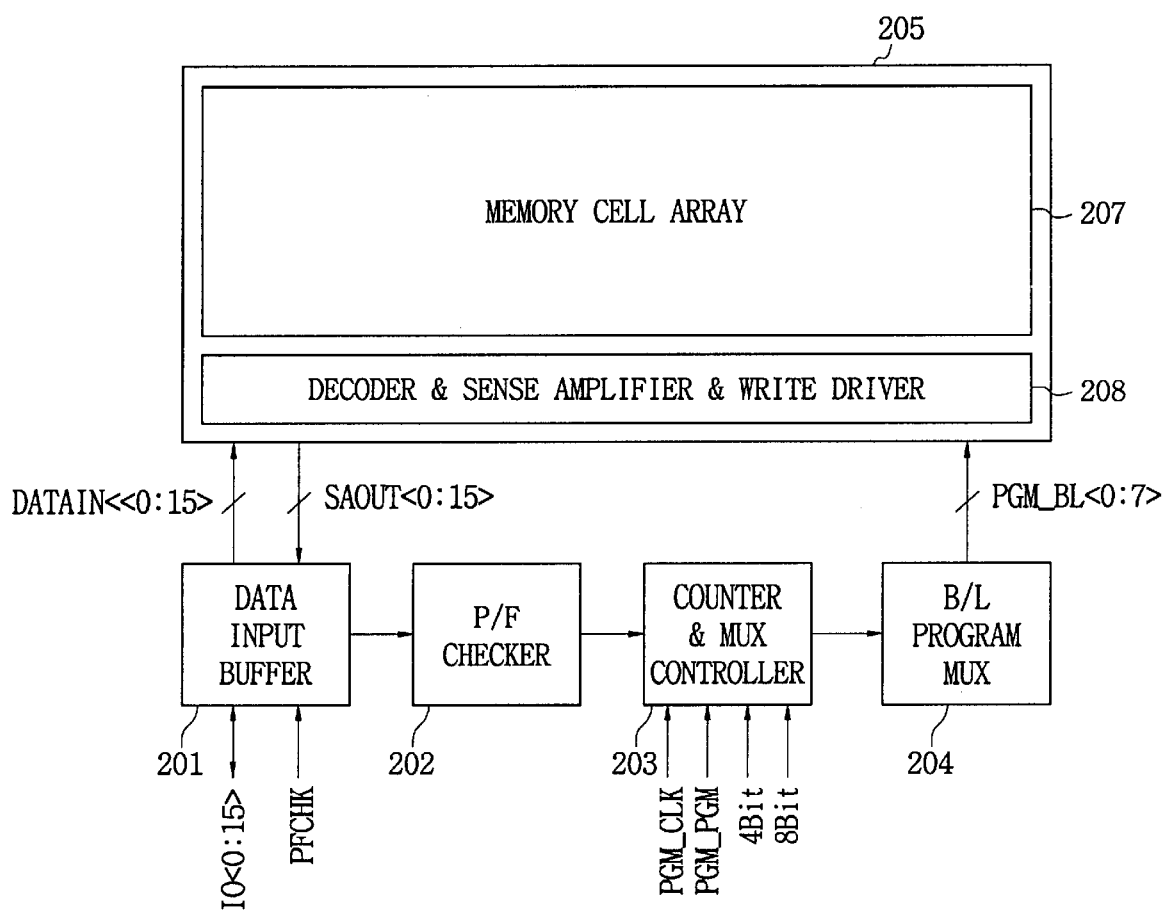
FIG. 2 is a block diagram of another structure of a nonvolatile semiconductor memory device employing a preferred embodiment of the present invention.

Referring FIG. 2, a nonvolatile memory device has a core block 205 having a memory cell array 207 and a decoder, sense amplifier and write driver 208, a data input/output buffer 201, a pass/fail (P/F) checker 202, a counter and multiplexer controller 203 and a bit line (B/L) program multiplexer 204. The counter and multiplexer controller 203 and the bit line (B/L) program multiplexer 204 correspond to the decoder block 17 in FIG. 1.

During the programming of certain memory cells in the memory cell array 207, if the data input/output buffer 201 receives a program command, for instance, a pass/fail check signal (PFCHK) from outside, the buffer 201 checks inputted external IO data, IO<0:15>, and the status of selected internal cells to be programmed to determine whether the programming of the memory cells is completed. Then, the data input/output buffer 201 outputs signals DTATIN<0:15>to the write driver 208. Then, the buffer 201 transmits passed/failed signals from the write driver 208 to the pass/fail (P/F) checker 202. After receiving the passed/failed signals from the write driver 208, the P/F checker 202 outputs a program fail signal (PGMfail) for determining whether the programming of the memory cells is completed. The counter and multiplexer controller 203 receives the program pass/fail signal (PGMfail) and various transmission signals (PGM_CLK, PGM_PGM, bit option signals of 4 Bits, 8 Bits) and outputs program bit control signals for dividing m memory cells by n to the bit line program multiplexer 204. The bit line program multiplexer 204 applies a coding signal, that is, a program bit line coding signal (PGM_BL<0:7>) to the write driver 208 for performing the program operation of the m memory cell at m/n times. For instance, if the number of memory cells are 16 (m=16) and the n is 2, the 2-bit program operation is performed eight times.

Figure 3:
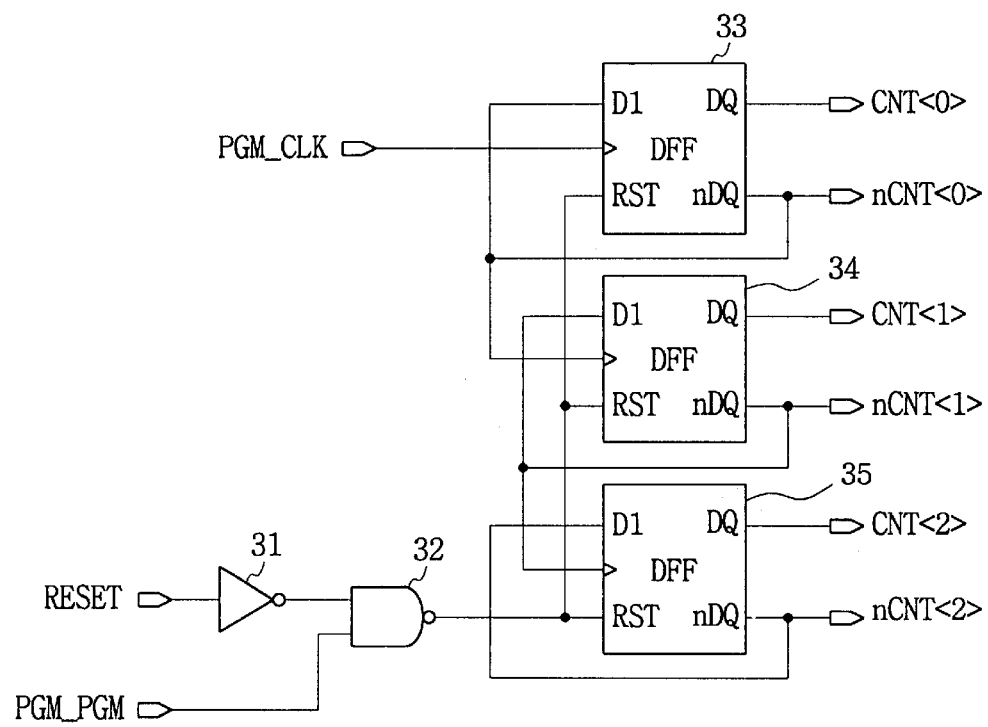
FIG. 3 is a schematic diagram of the counter and multiplexing controller shown in FIG. 2.
Figure 3:
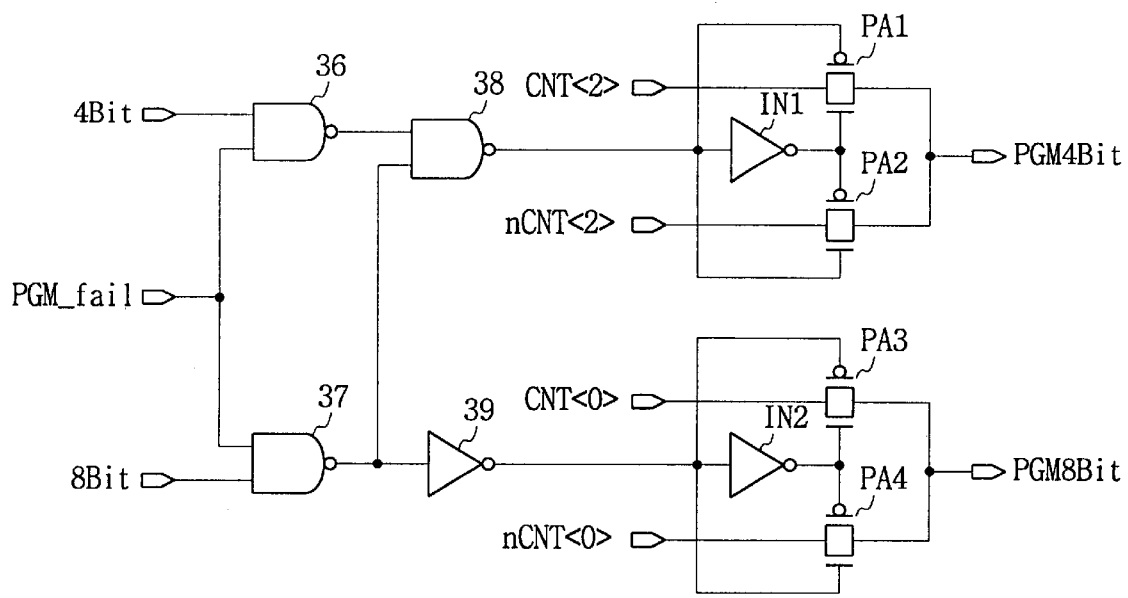

FIG. 3 is a block diagram illustrating the counter and multiplexing controller 203 shown in FIG. 2. As shown in FIG. 3, the counter and multiplexing controller 203 includes a plurality of D type flip flops 33, 34, 35, inverter 31, 39, IN1, IN2, NAND gates 32, 36, 37, 38, a plurality of transmission gates PA1, PA2, PA3, PA4. The inverter 31 receives a RESET signal and outputs an inverted signal to the NAND gate 32. The NAND gate 32 receives the inverted signal of the inverter 31 and the program signal (PGM_PGM), and outputs NAND response to the plurality of D type flip flops 33, 34, 35. The plurality of D type flip flops 33, 34, 35 receive program clocks PGM_CLK and the NAND response of the NAND gate 32 at a respective reset terminal, and outputs count signals (CNT<0,1,2>) and their complementary count signals (nCNT<0,1,2>) at a respective output terminal. The NAND gate 36 receive a bit option signal, for example, a bit option signal of 4 bits and a program fail signal (PGM_fail) from the P/F checker 202, and generates a NAND response, and a NAND gate 37 receives a bit option signal of 8 bits and a program fail signal (PGM_fail), and generates a NAND response. A NAND gate 38 receives the outputs of the NAND gates 36, 37 and outputs NAND responses. An inverter 39 inverts the output of the NAND gate 37 and outputs the inverted result to the inverter IN2. The inverter IN1 inverts the output of the NAND gate 38 and outputs the inverted signal to the gates of transmission gates PA1, PA2, which are formed by n type and p type MOS transistors. An output of the inverter IN2 is supplied to the gates of transmission gates PA3, PA4, formed by n type and p type MOS transistors. The transmission gates PA1, PA2, PA3, PA4 respectively receive count signal (CNT<2>), complementary count signal (nCNT<2>), count signal (CNT<0>) and complementary count signal (nCNT<0>), and outputs program bit signals, PGM 4 bits and PRM 8 bits.

Figure 4:
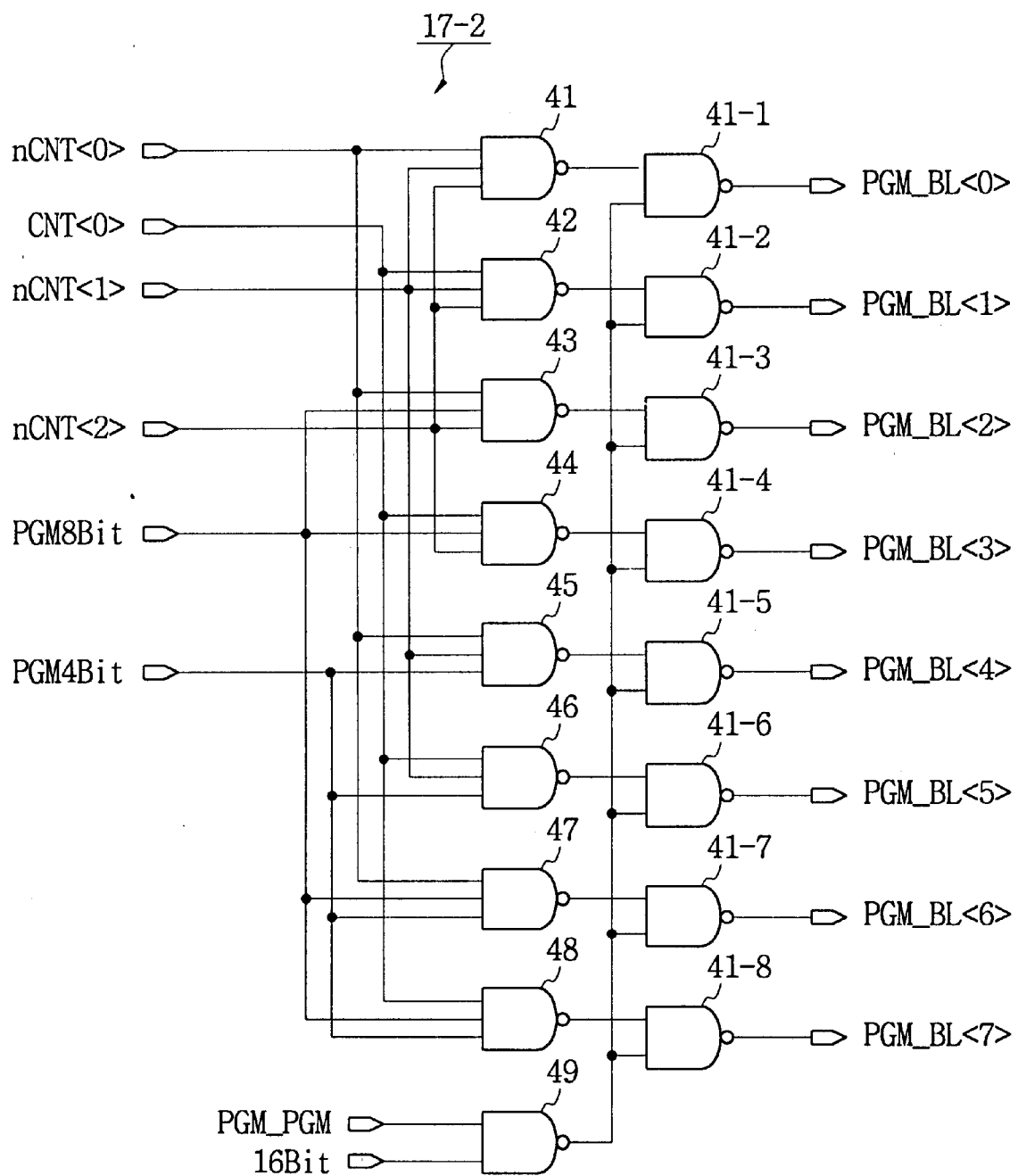
FIG. 4 is a schematic diagram of the multiplexer shown in FIG. 2.

FIG. 4 is a diagram illustrating the bit line program multiplexer 204 shown in FIG. 2. As shown in FIG. 4, a plurality of NAND gates 41~48 receive count signal (CNT<0>), complementary count signals (nCNT<0,1,2>) and program bit signals (PGM 8 Bit, PGM 4 Bit) at respective input terminals. A NAND gate 49 receives a program signal (PGM_PGM) and a bit option signal of 16 Bits to generate its NAND response.

Figure 5:
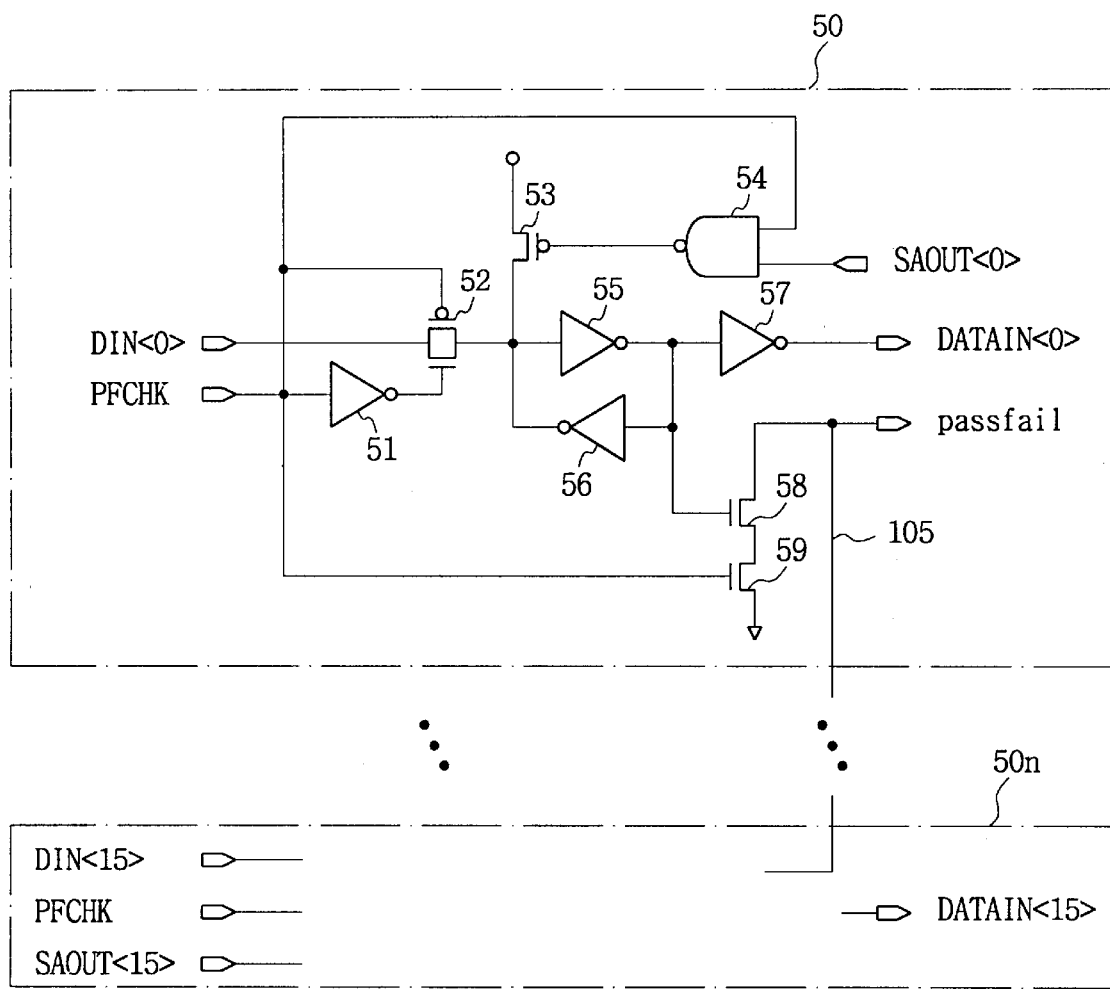
FIG. 5 is a schematic diagram of the data input/output buffer shown in FIG. 2.

FIG. 5 is a diagram illustrating the data input/output buffer 201 shown in FIG. 2, each of the unit buffers 50~50n comprises: a transmission gate 52, inverters 55, 57 sequentially connected to an output terminal of the transmission gate 52, a NAND gate 54 for NAND gating a pass/fail check signal (PFCHK) and a sense amplifier output signal (SAOUT<0>), a p type MOS transistor 53 for fixing the output terminal of the transmission gate 52 at a predetermined level thereof in response to the output of the NAND gate 54, an inverter 56 whose input is connected to an output terminal of the inverter 55 and its output is connected to an input terminal of the inverter 55, a n type MOS transistor 58 for outputting a pass/fail signal (P/F) to the drain with response to the output of the inverter 55 and a n type MOS transistor 59 with its channel being connected between a source of the transistor 58 and ground for receiving the pass/fail check signal (PFCHK) with its gate.

Figure 6:
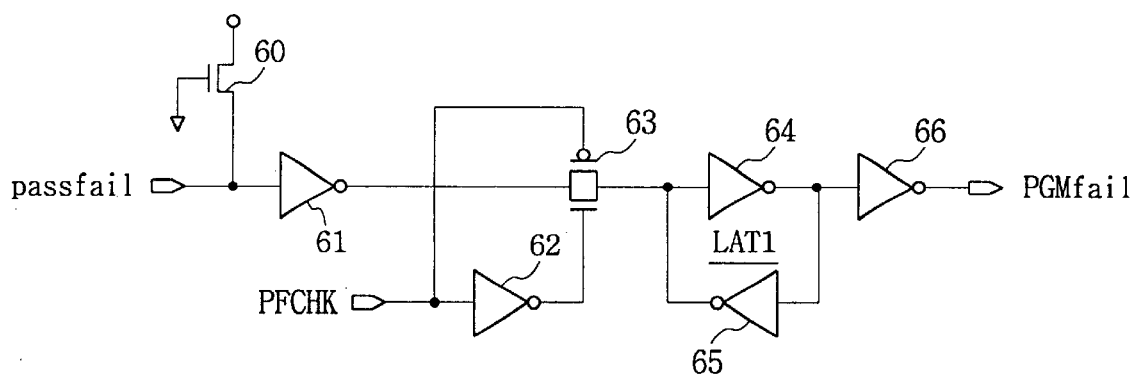
FIG. 6 is a schematic diagram of the pass/fail checker shown in FIG. 2.

FIG. 6 is a diagram illustrating the P/F checker 202 shown in FIG. 2. As shown in FIG. 6, the P/F checker includes a power supply transistor 60, an inverter 61 for inverting the pass/fail signal, a transmission gate 63 for transmitting an output of the inverter 61 to its output terminal with response to a pass/fail check signal, an inverter latch LAT1 for latching an output of the transmission gate 63 and an output inverter 66 for inverting an output of the inverter latch LAT1 and outputting it as a program fail signal.

Figure 7A:
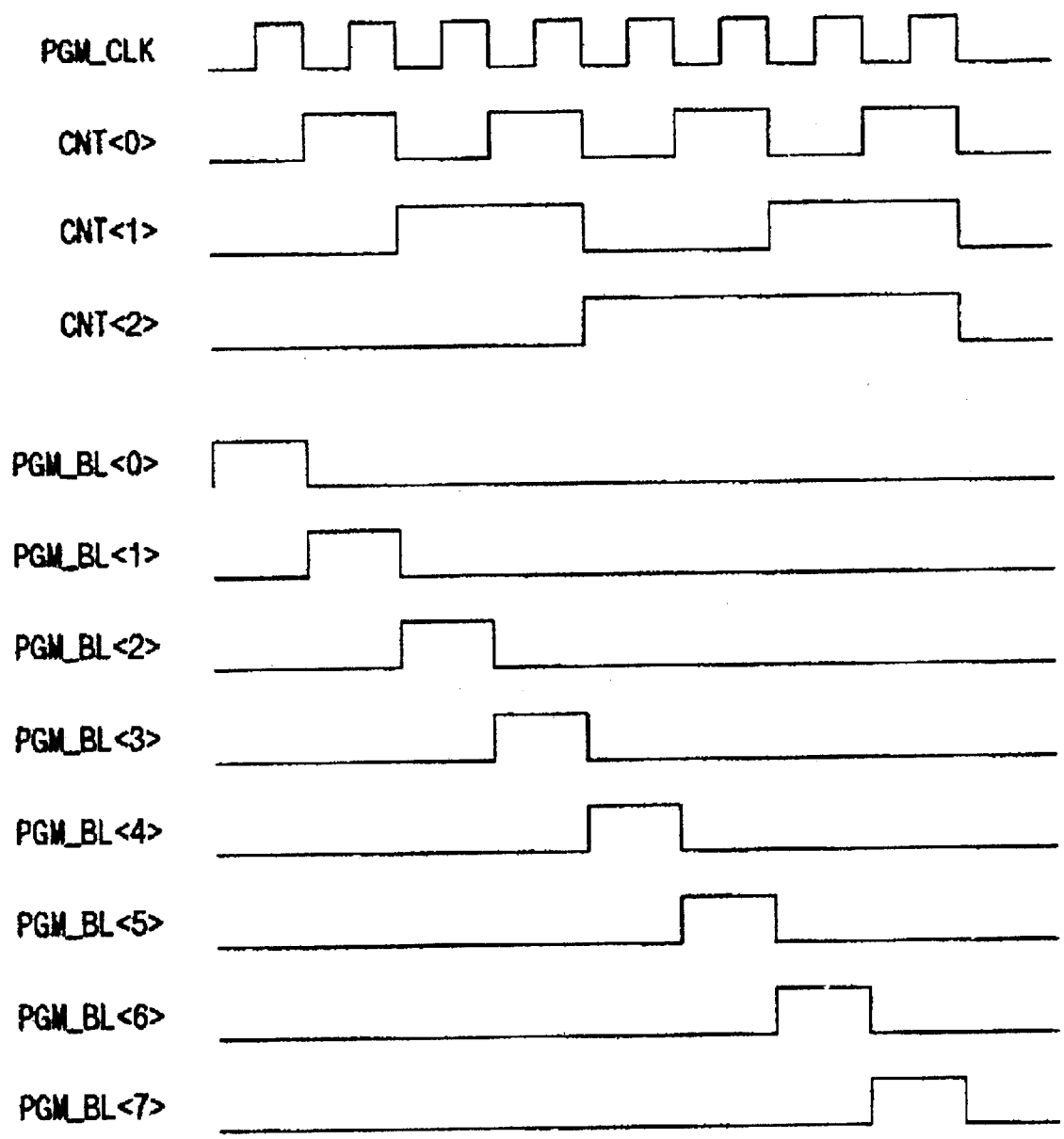
FIGS. 7A through 7D are timing diagrams showing 2, 4, 8, 16-bit program operations, respectively, according to a preferred embodiment of the present invention.
Figure 7B:
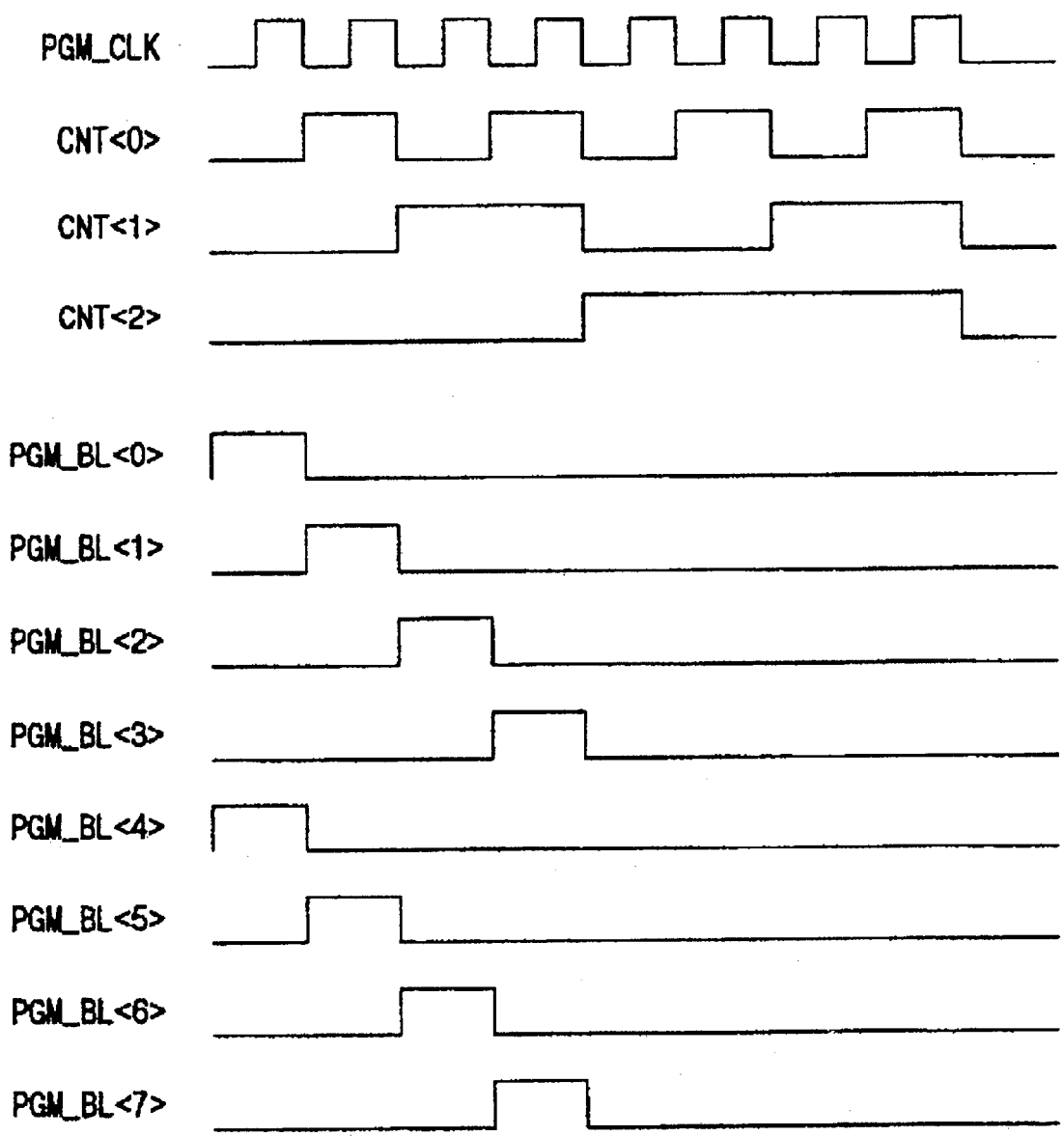
Figure 7C:
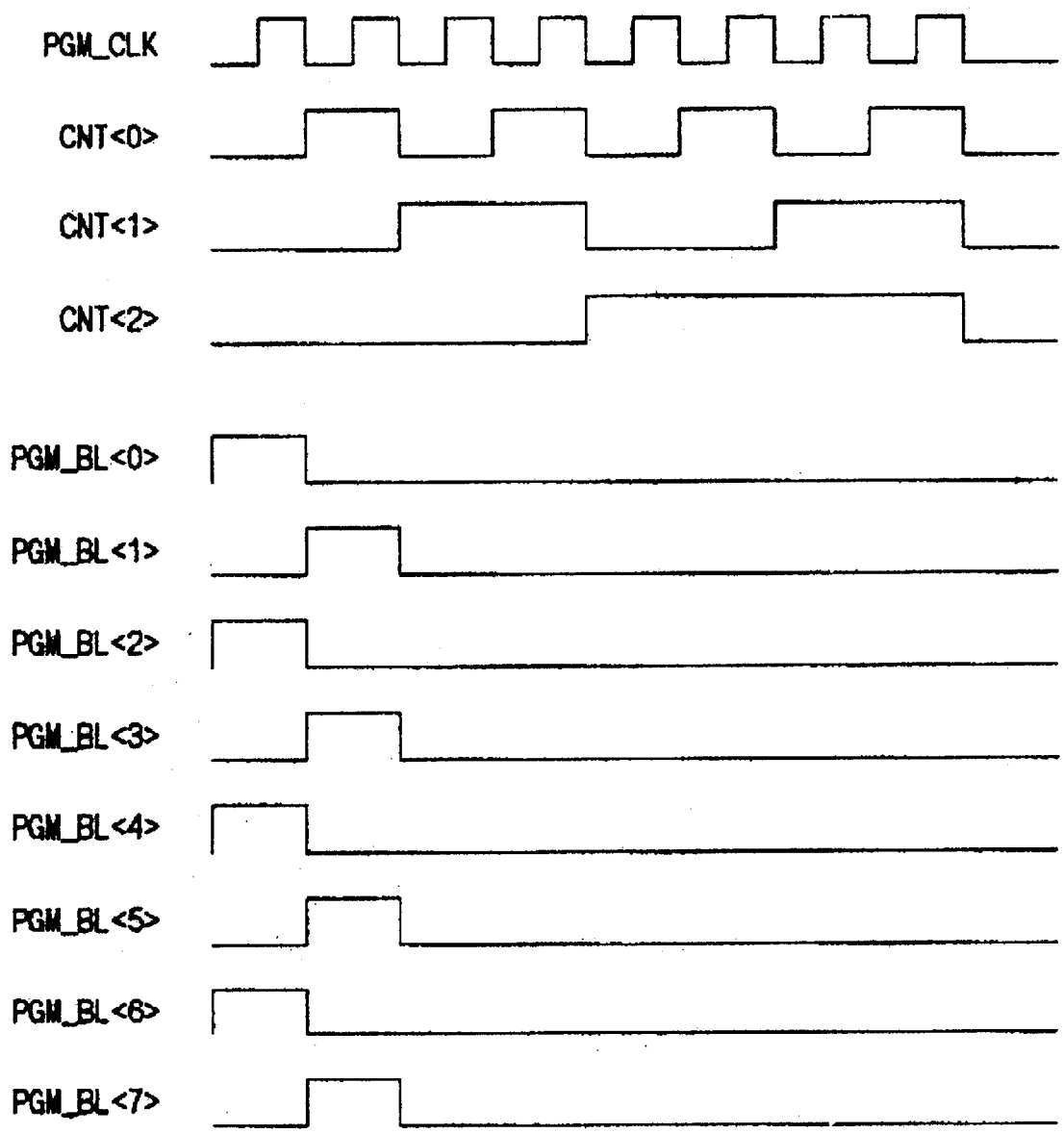
Figure 7D:
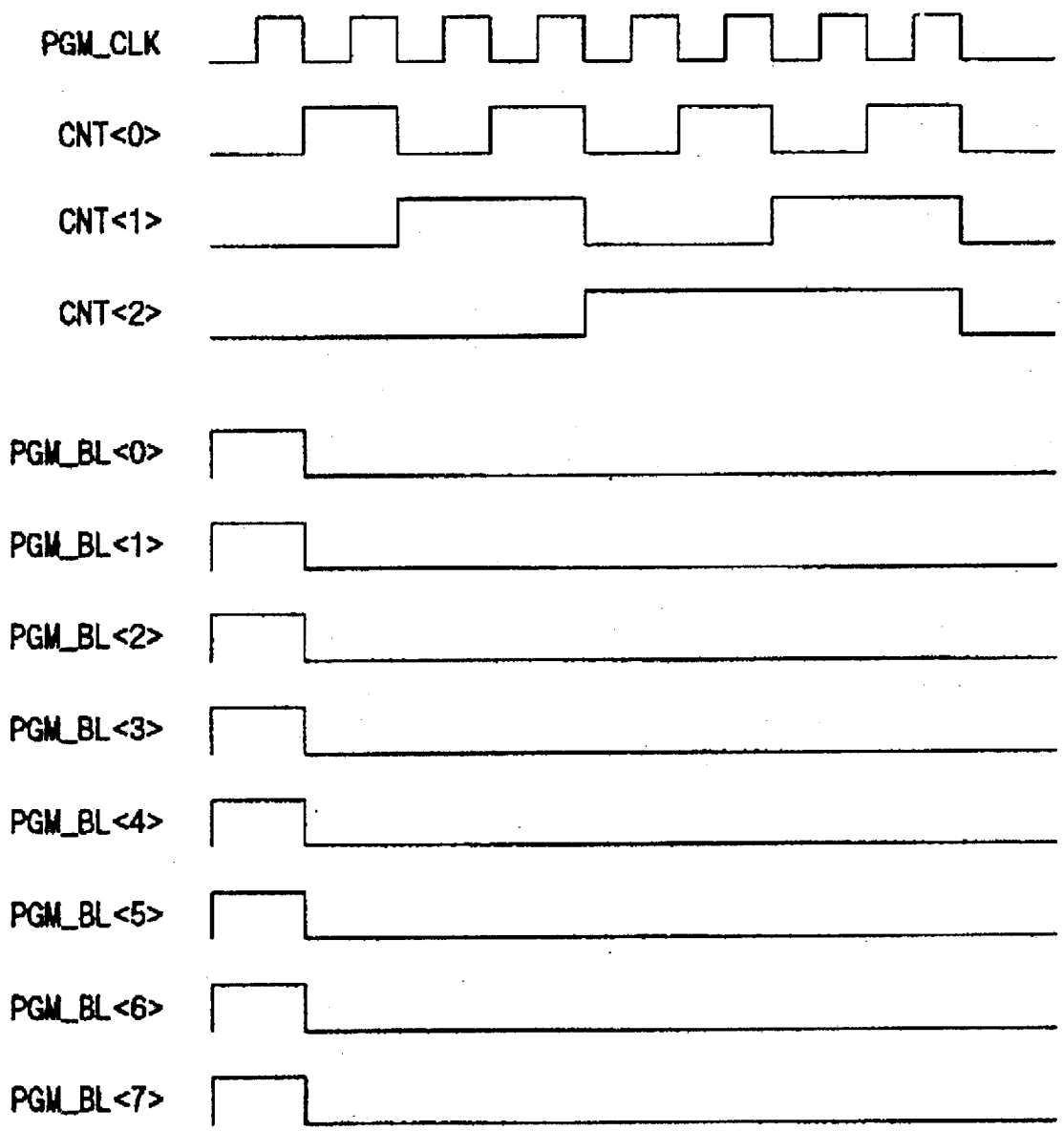
Figure 8A:
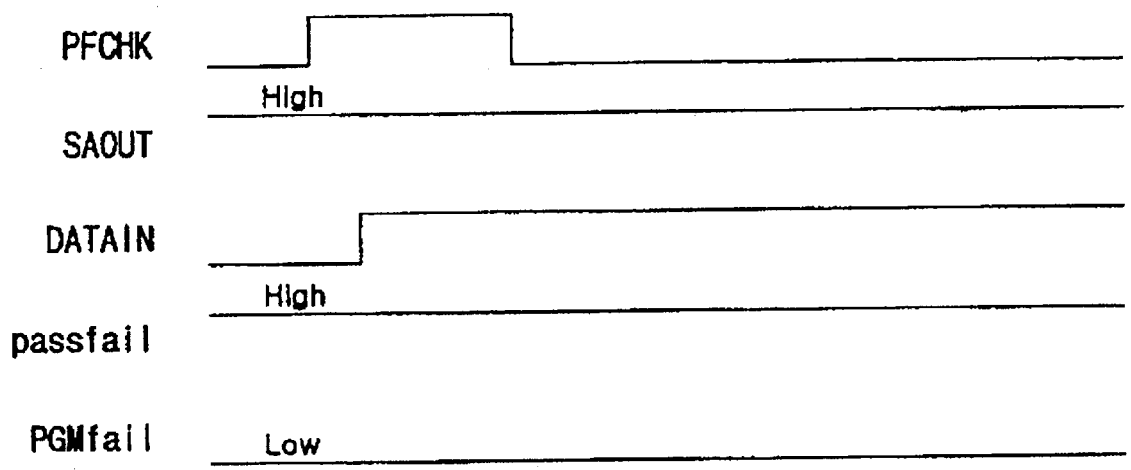
FIG. 8A shows a timing diagram of the program completing of memory cells according to a preferred embodiment of the present invention.
Figure 8B:
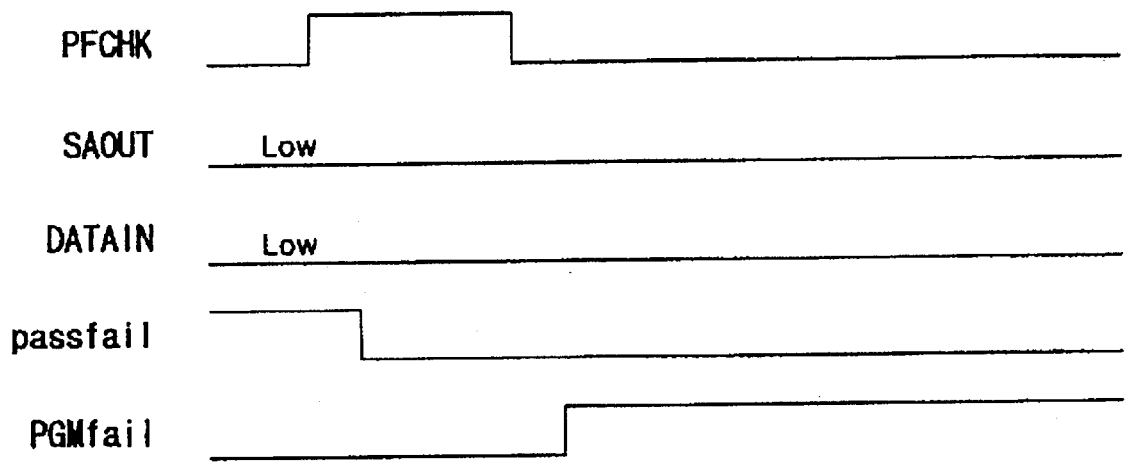
FIG. 8B shows a timing diagram of the program performing of memory cells according to a preferred embodiment of the present invention.
Figure 9A:
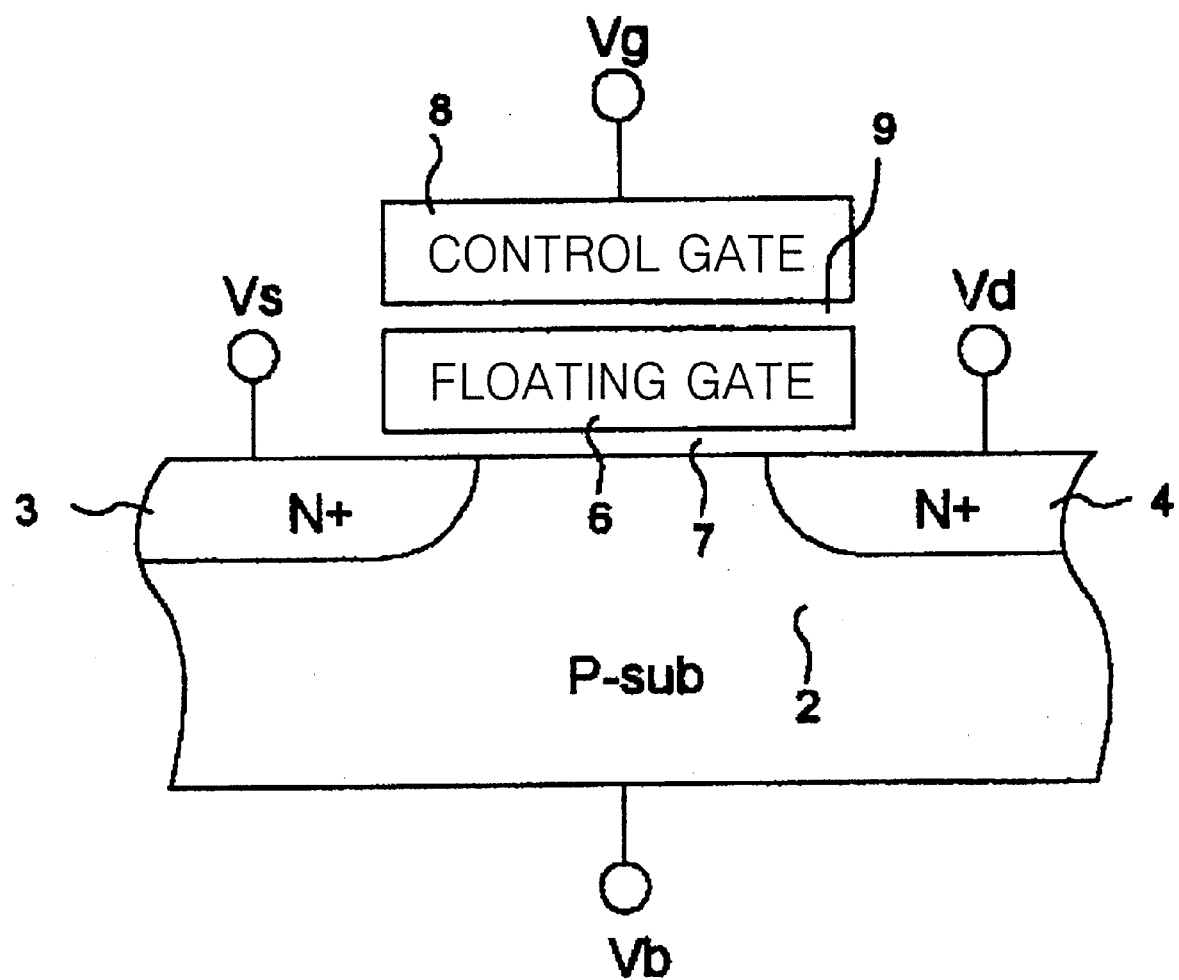
FIG. 9A is a block diagram illustrating a cross-section of a conventional NOR memory cell transistor.
Figure 10:
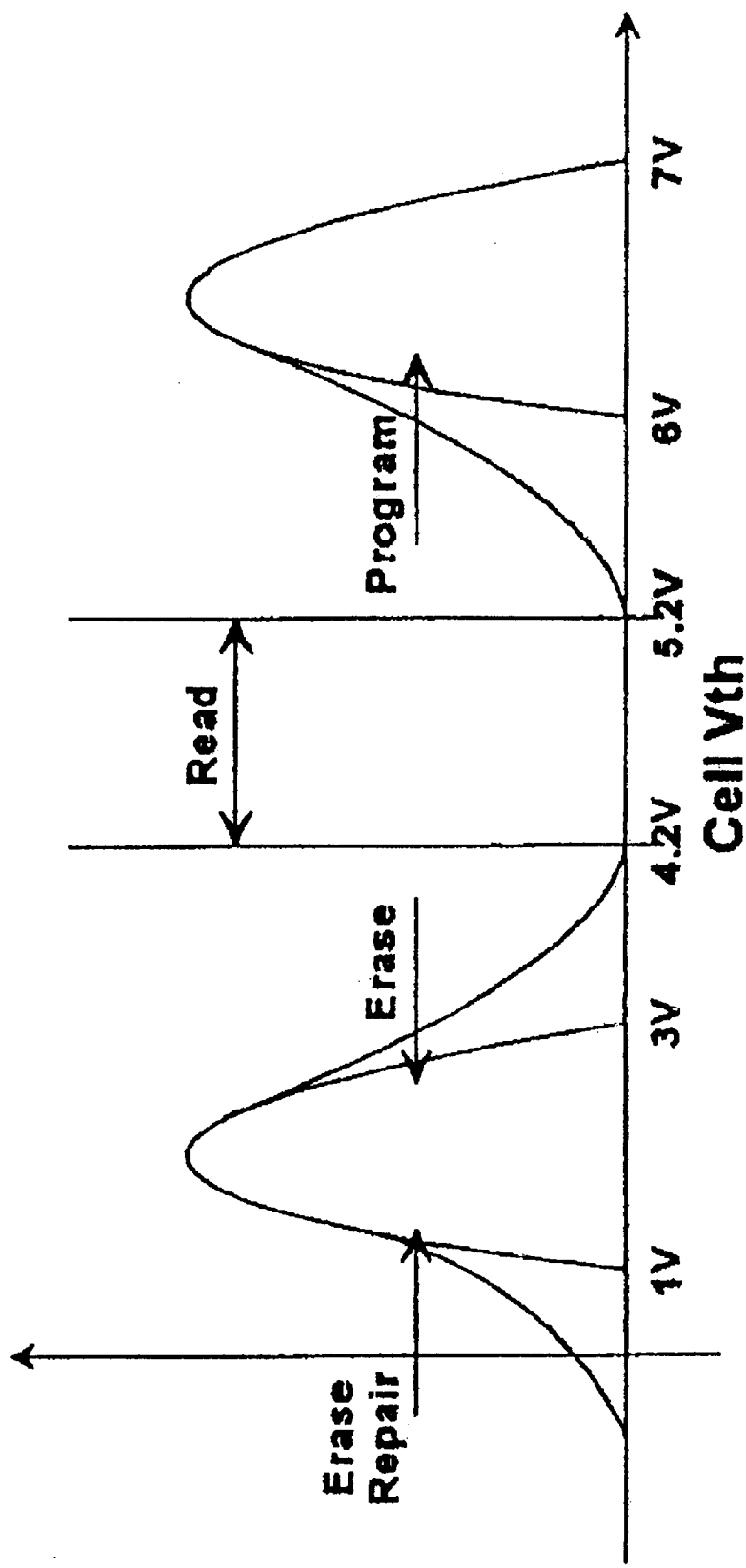
FIG. 10 is a graph showing distribution of threshold voltages of the conventional NOR memory cell transistor in FIG. 9A.

FIGS. 7A through 7D are timing diagrams showing 2, 4, 8, 16-bit program operations according to a preferred embodiment of the present invention, respectively, and FIGS. 8A and 8B are timing diagrams showing the completing and performing of the program operations according to a preferred embodiment of the present invention.

If the data input/output buffer 201 receives a program command, for example, PFCHK, from outside, the buffer 201 checks external IO data, IO<0:15>and the status of internal cells SAOUT<0:15>selected to be programmed. And, the data input/output buffer 201 transmits signals DATAIN<0:15>to the write drivers 208 and, at the same time, outputs passed/failed signal to the pass/fail (P/F) checker 202. After receiving the pass/fail signal, the P/F checker 202 outputs a program fail signal (PGMfail) for determining whether the program is completed.

At this time, as shown in FIGS. 8A and 8B, if the programming is not completed, the program fail signal (PGMfail) is logic "H." On the contrary, if all memory cells are programmed, that is, the programming is completed, the program fail signal (PGMfail) is logic "L." The counter and multiplexer controller 203 receives the program fail signal (PGMfail) and various input signals, for example, PGM_CLK, PGM_PGM, bit option signals of 4 Bits and 8 Bits and outputs a program bit control signal. The program bit control signal controls the number of program operations of the selected memory cells. For example, if the number of selected memory cells is 16, the number of the selected memory cells is divided by 2 and the number of program operations is eight times. The bit line program multiplexer 204 receives the program bit control signal and inputs a coding signal, that is, the program bit line signals (PGM_BL<0:7>) to the write driver 208. The coding signals divides the memory cells by 2, thereby the divided memory cells are programmed eight times. FIG. 7A shows a timing diagram of 2-bit program operation, in which the 2-bit program operation is performed eight times. At a first 2-bit program operation, a PGM_BL<0>of the program bit coding line signals is coded, the memory cell transistors corresponding to IO (0,8) is programmed; at a second subprogram operation, a PGM_BL<1>is coded and the memory cell transistors corresponding to IO (1,9) is programmed. Such a programming is performed eight times, and a first program operation is completed. The time for the first program operation is referred to 1T.

After completion of the first program operation, a program checking operation is followed again, as described above. The program pass/fail checking operation is performed to determine whether the program operations of all the selected memory cells are completed. In other words, if the P/F checker 202 outputs the program fail signal of logic "H," a second program operation is performed. At this time, the number of the program operation is determined according to a bit option signal among the bit option signals of 4 bits and 8 bits. For instance, when the bit option signal of 4 bits is selected, the number of the program operation is four times. That is, after the counter and multiplexer controller 203 receives the program fail signal (PGMfail) and various input signals, the controller 203 outputs the program bit control signal for dividing 16 memory cells by 4 and performing the program by the unit of 4 memory cells four times. According to the program bit control signal, the bit line program multiplexer 204 inputs the program bit line signals (PGM_BL<0:7>) for dividing 16 memory cells by 4 to the write driver 208.

FIG. 7B shows a timing diagram of the 4-bit program operations at the second program operation. At a first 4-bit program operation, the PGM_BL<0,4>among the program bit line signals is code and memory cell transistors corresponding to IO (0,4,8,12) are programmed. At a second subprogram operation, the PGM_BL<1,5>are coded, and the memory cell transistors corresponding to IO (1,5,9,13) are coded. Such program operation is performed four times, and the second program operation is completed. The time for the second program operation is half of the time for the first program operation, T, that is, ½T. FIGS. 7C and 7D show timing diagrams illustrating 8 and 16-bit program operations at third and fourth program operations, respectively.

Advantageously, preferred embodiments according to the present invention reduce the programming time of memory cells according to the number of programming bits of the memory cells in reprogramming.

While the invention has been mainly described mainly about preferred embodiments with reference to the drawings, the preferred embodiment is only an example, but various changes and modifications can be made within the spirit and scope of the appended claims. For instance, the present invention can be applied to a nonvolatile memory device having a NAND or AND structure. Furthermore, the states of logic shown in the drawings can be also replaced with other equivalent circuit or logic elements.

As described above, there is an advantage in the present invention in that a significant reduction is made in the time to be taken to perform the program operations at a high speed.

What is claimed is:

1. A method for programming a plurality of memory cells of a nonvolatile semiconductor memory device in response to input data having a plurality of bit information comprising the steps of:
   dividing m number of memory cells by n-bit units, wherein m and n are integers not less than 2;
   programming the m number of memory cells by m/n times;
   checking whether programming of the plurality of memory cells is complete; and
   increasing the n-bit units by multiplying n by 2 if any memory cell fails the programming operation;
   reprogramming the m number of memory cells in units of increased n-bit units.

2. The method of claim 1, further comprising the step of finishing the programming operation without reprogramming of the m number of memory cells if all the memory cells complete the programming operation.

3. The method of claim 1, wherein the nonvolatile semiconductor memory device is a NOR type flash EEPROM.

4. The method of claim 1, wherein the step of reprogramming the plurality of memory cells reprograms all the memory cells regardless of the number of memory cells programmed at the previous step of programming the plurality of memory cells.

5. The method of claim 1, further comprising the step of finishing the programming operation when the programming of the m number of memory cells is performed as many times as predetermined.

6. A method for programming a plurality of memory cells of a nonvolatile semiconductor memory device comprising the steps of:

dividing m number of memory cells by n-bit units, wherein m and n are integers not less than 2;

programming the plurality of memory cells by raising a threshold voltage of each memory cell, wherein the programming is performed m/n times;

checking a threshold voltage of each programmed memory cell for determining whether the programmed memory cell completes the programming; and increasing the n-bit units by multiplying n by 2 if the threshold of any memory cell among the programmed memory cells is below a predetermined level;

reprogramming the m number of memory cells in units of increased n-bit units.

7. A nonvolatile semiconductor memory device having a plurality of memory cells, in which the plurality of memory cells are programmed in response to input data having a plurality of bit information, the nonvolatile semiconductor device comprising:

dividing means for dividing m number of memory cells by n-bit units, wherein m and n are integers not less than 2;

program means for performing program operations of m number of memory cells by m/n times;

checking means for checking the programmed memory cells to determine all the memory cells complete the program operations; and multiplying means for multiplying n by 2 if any memory cell fails the programming operation;

wherein the program means performs reprogramming of the m number of memory cells in units of multiplied n-bit units.

* * * * *